(12) United States Patent
Tan

(10) Patent No.: US 11,190,142 B1
(45) Date of Patent: Nov. 30, 2021

(54) SIGNAL AMPLIFYING CIRCUIT DEVICE AND RECEIVER

(71) Applicant: Hangzhou Geo-chip Technology Co., Ltd., Hangzhou (CN)

(72) Inventor: Chun Geik Tan, San Diego, CA (US)

(73) Assignee: HANGZHOU GEO-CHIP TECHNOLOGY CO., LTD.

( * ) Notice: Subject to any disclaimer, the term of this patent is extended or adjusted under 35 U.S.C. 154(b) by 0 days.

(21) Appl. No.: 16/927,292

(22) Filed: Jul. 13, 2020

(51) Int. Cl.
| | |
|---|---|
| *H03F 3/45* | (2006.01) |
| *H03F 1/02* | (2006.01) |
| *H03F 3/195* | (2006.01) |

(52) U.S. Cl.
CPC .......... *H03F 1/0277* (2013.01); *H03F 3/195* (2013.01); *H03F 2200/451* (2013.01)

(58) Field of Classification Search
CPC .......................................................... H03F 3/45
USPC .................................................... 330/260, 99
See application file for complete search history.

(56) References Cited

U.S. PATENT DOCUMENTS

| | | | |
|---|---|---|---|
| 8,463,225 B2 * | 6/2013 | Igarashi | H04B 1/30 455/333 |
| 9,692,473 B2 * | 6/2017 | Gard | H03F 3/45071 |

\* cited by examiner

*Primary Examiner* — Henry Choe
(74) *Attorney, Agent, or Firm* — McDonnell Boehnen Hulbert & Berghoff LLP

(57) ABSTRACT

A signal amplifying circuit device comprises a mixer and a first and second amplifiers connected in series, where the mixer is configured to receive an RF signal and two LO signals with a preset phase difference therebetween and output a first and a second mixed signals, the first amplifier includes a first input terminal for receiving the first mixed signal, a second input terminal for receiving the second mixed signal, and a first and second output terminals, the second amplifier includes a first input terminal connected to the first output terminal of the first stage of amplifier at a first joint, a second input terminal connected to the second output terminal of the first stage of amplifier at a second joint, a first output terminal, and a second output terminal. A receiver including the signal amplifying circuit device is also disclosed.

8 Claims, 4 Drawing Sheets

SIGNAL AMPLIFYING CIRCUIT DEVICE AND RECEIVER

TECHNICAL FIELD

The present disclosure relates to the field of telecommunication technology, in particular to a signal amplifying circuit device and a receiver.

BACKGROUND

The traditional receiver receives a Radio Frequency (RF) signal via its antenna, and the RF signal may sequentially pass through a band-pass or low-pass filter, a Matching Network (MN), a Low-Noise Amplifier (LNA), a mixer, an analog baseband filter, an Analog-to-Digital Converter (ADC) and a digital demodulator on a Printed Circuit Board (PCB), thereby obtaining the required signal. The specification of the traditional receiver requires for the achievement of a sufficient gain, a low noise figure below for example 3 dB, and a low reflection coefficient (for example, an input reflection coefficient S11 below −10 dB) and complies with the predefined Input Third-order Intercept Point (IIP3) specification. However, the existing wideband receivers with source impedance matching suffer from a high noise figure, poor linearity, a large chip area, and large power consumption.

SUMMARY

The present disclosure provides a signal amplifying circuit device and a receiver, to address one or more of the problems existing in the prior art.

In an aspect, an embodiment provides a signal amplifying circuit device, including a mixer, a first stage of amplifier and a second stage of amplifier which are connected in series, where the mixer is configured to receive a Radio Frequency signal and two local oscillator signals with a preset phase difference therebetween, and output a first mixed signal and a second mixed signal based on the Radio Frequency signal and the two local oscillator signals, the first stage of amplifier includes a first input terminal configured for receiving the first mixed signal, a second input terminal configured for receiving the second mixed signal, a first output terminal, and a second output terminal, the second stage of amplifier includes a first input terminal which is connected to the first output terminal of the first stage of amplifier at a first joint, a second input terminal which is connected to the second output terminal of the first stage of amplifier at a second joint, a first output terminal, and a second output terminal; a first resistor is connected in parallel between the first input terminal of the first stage of amplifier and the first output terminal of the second stage of amplifier, another first resistor is connected in parallel between the second input terminal of the first stage of amplifier and the second output terminal of the second stage of amplifier, a second resistor is connected in parallel between the first joint and the first output terminal of the second stage of amplifier, and another second resistor is connected in parallel between the second joint and the second output terminal of the second stage of amplifier.

In an embodiment, the mixer includes a first transistor switch and a second transistor switch, the first transistor switch includes a gate configured for receiving a first local oscillator signal, a drain configured for outputting the first mixed signal, and a source;

the second transistor switch includes a gate configured for receiving a second local oscillator signal, a drain configured for outputting the second mixed signal, and a source;

the sources of the first transistor switch and the second transistor switch are configured for receiving the Radio Frequency signal.

In an embodiment, the first local oscillator signal has a phase of 0°, and the second local oscillator signal has a phase of 180°; or the first local oscillator signal has a phase of 90°, and the second local oscillator signal has a phase of 270°.

In an embodiment, the first stage of amplifier and/or the second stage of amplifier include a single-stage Complementary Metal Oxide Semiconductor circuit unit.

In an embodiment, the single-stage Complementary Metal Oxide Semiconductor circuit unit includes a first transistor, a second transistor, a third transistor, and a fourth transistor;

the gates of the first transistor and the third transistor are connected as the first input terminal, the gates of the second transistor and the fourth transistor are connected as the second input terminal, the drains of the first transistor and the third transistor are connected as the second output terminal, and the drains of the second transistor and the fourth transistor are connected as the first output terminal.

In an embodiment, the first stage of amplifier and/or the second stage of amplifier include a multi-stage Complementary Metal Oxide Semiconductor circuit unit, and the multi stage Complementary Metal Oxide Semiconductor circuit unit includes an input subunit, a gain subunit and an output subunit which are sequentially connected in series.

In an embodiment, the input subunit includes a first transistor and a second transistor, a gate of the first transistor serves as the first input terminal, a gate of the second transistor serves as the second input terminal, the sources of the first transistor and the second transistor are connected to a supply voltage VDD, and the drains of the first transistor and the second transistor are connect to a ground voltage $V_{SS}$;

the gain subunit includes a third transistor, a fourth transistor, a fifth transistor and a sixth transistor, gates of the third transistor and the fourth transistor are both connected to a first voltage, sources of the third transistor and the fourth transistor are both connected to the supply voltage VDD, and drains of the third transistor and the fourth transistor are connected to the ground voltage $V_{SS}$;

gates of the fifth transistor and the sixth transistor are both connected to a second voltage, sources of the fifth transistor and the sixth transistor are connected to the supply voltage VDD, and drains of the fifth transistor and the sixth transistor are connected to the ground voltage $V_{SS}$;

the output subunit includes a seventh transistor, an eighth transistor, a ninth transistor and a tenth transistor; a gate of the seventh transistor and sources of the third and fourth transistors are connected at a third joint, a source of the seventh transistor is connected to the supply voltage VDD, drains of the seventh and eighth transistors are connected as the first output terminal, and a gate and a source of the eighth transistor are connect to the ground voltage VSS;

a gate of the ninth transistor and sources of the fifth and sixth transistors are connected at the fourth joint, a source of the ninth transistor is connected to supply voltage VDD, drains of the ninth and tenth transistors are connected as the second output terminal, and a gate and a source of the tenth transistor are connected to the ground voltage VSS.

In a further aspect, a receiver is disclosed and includes at least one signal amplifying circuit device as described above.

The above technical solutions are advantageous in that: due to the incorporation of the mixer as well as the nested transimpedance amplifier including the first amplifier, the second amplifier, the first resistor and the second resistor into the signal amplifying circuit device, the source impedance matching is satisfied, the noise figure is effectively reduced, the gain is increased, and the linearity is improved, furthermore, the area and power consumption of the circuit is reduced.

The above description is provided for the purpose of better understanding of the present disclosure, but is not intended to limit the present invention in any way. In addition to the illustrative aspects, embodiments and features as described herein with reference to the drawings, additional aspects, embodiments and features would become apparent to those skilled in the art.

BRIEF DESCRIPTION OF THE DRAWINGS

Unless otherwise specified, the similar reference numerals represent the same or similar parts or elements throughout the drawings. These drawings are not necessarily made in proportion. It should be appreciated that these drawings merely illustrate some embodiments of the present invention and are not intended to limit the scope of the present invention.

LIST OF REFERENCE NUMERALS

Figure 1:
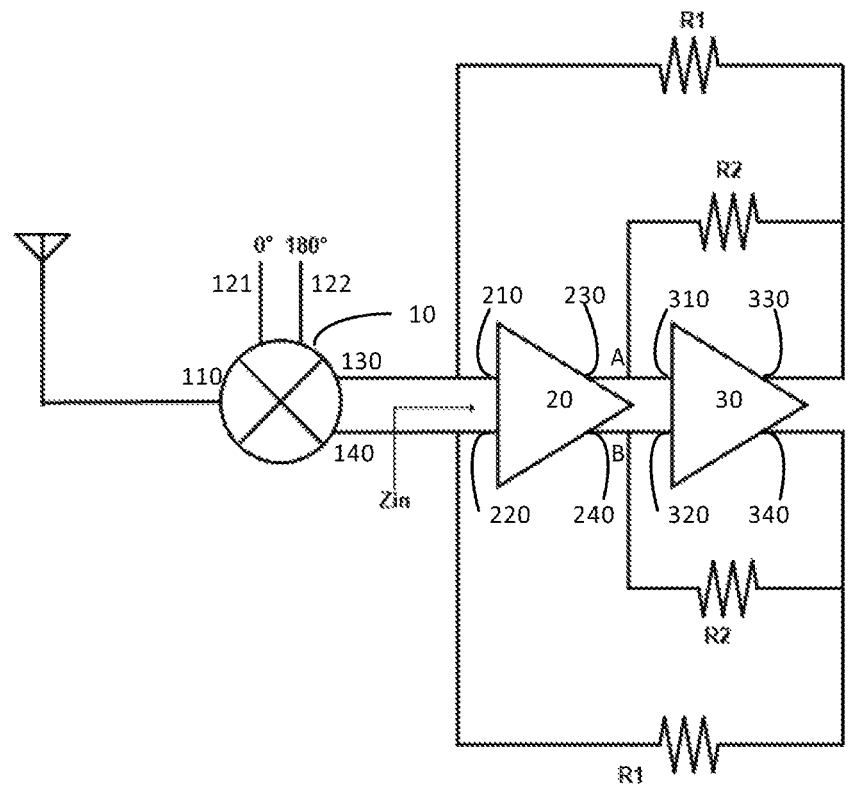
FIG. 1 is a schematic structural diagram of a signal amplifying circuit device according to an embodiment of the present invention.
Figure 2:
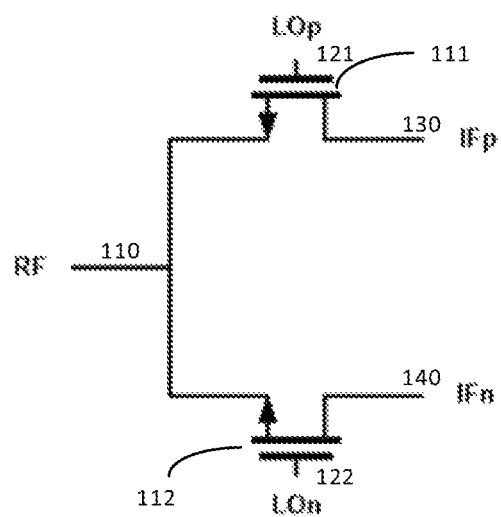
FIG. 2 is a schematic structural diagram of a mixer according to an embodiment of the present invention.
Figure 3:
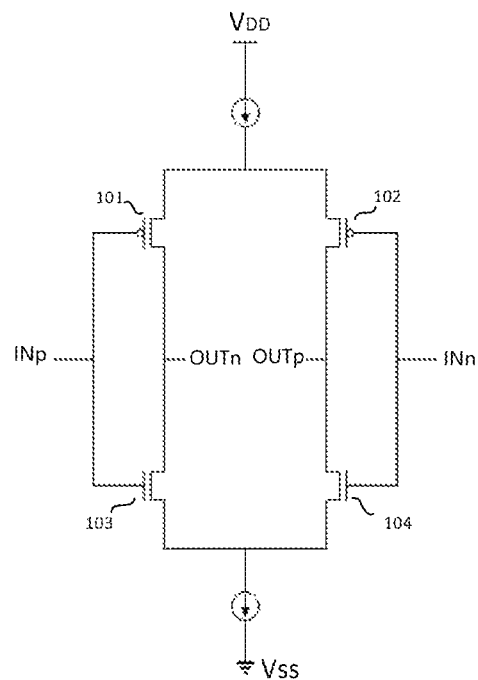
FIG. 3 is a schematic structural diagram of a first or second stage of amplifier according to an embodiment of the present invention.
Figure 4:
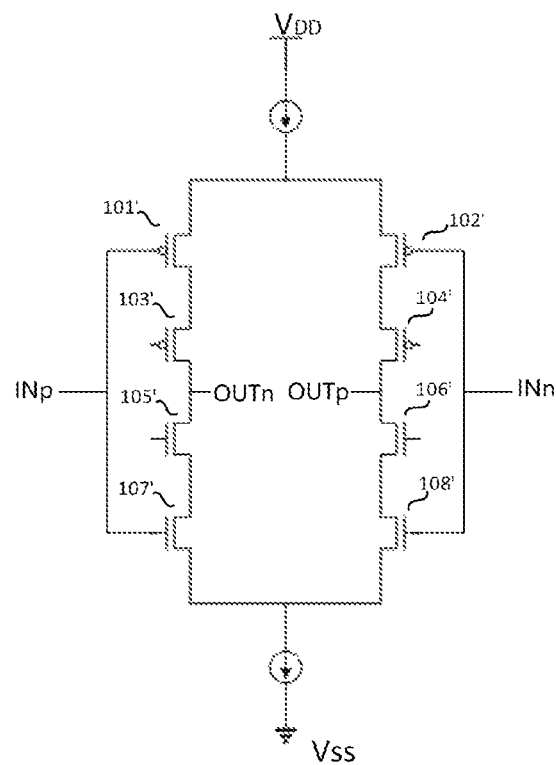
FIG. 4 is a schematic structural diagram of a first or second stage of amplifier according to another embodiment of the present invention.
Figure 6:
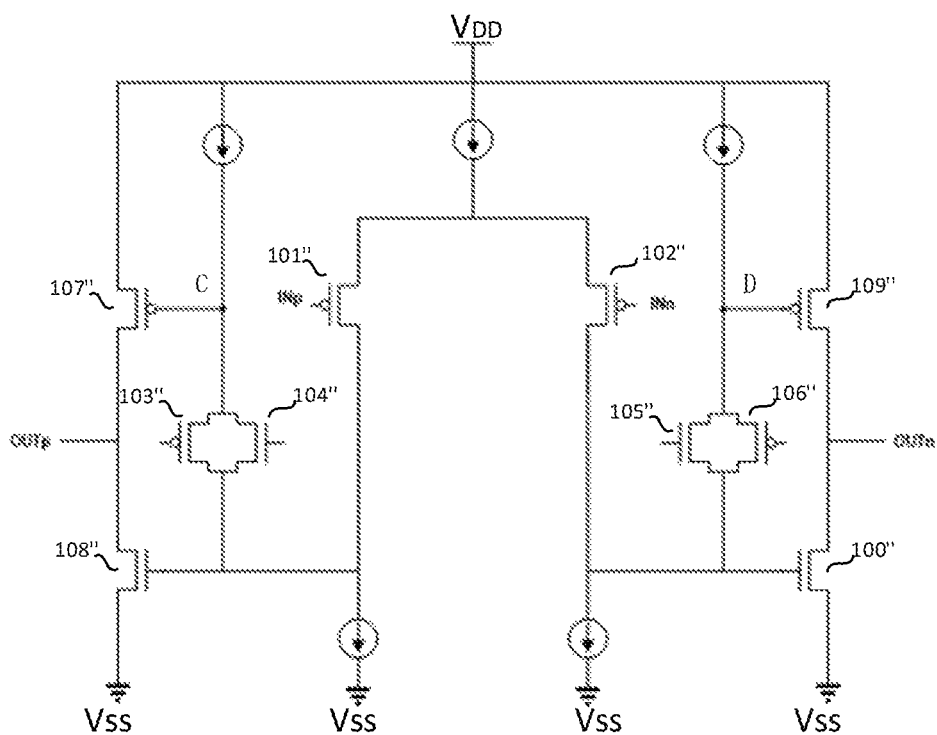
FIG. 6 is a schematic structural diagram of a first or second stage of amplifier according to still another embodiment of the present invention.
Figure 7:
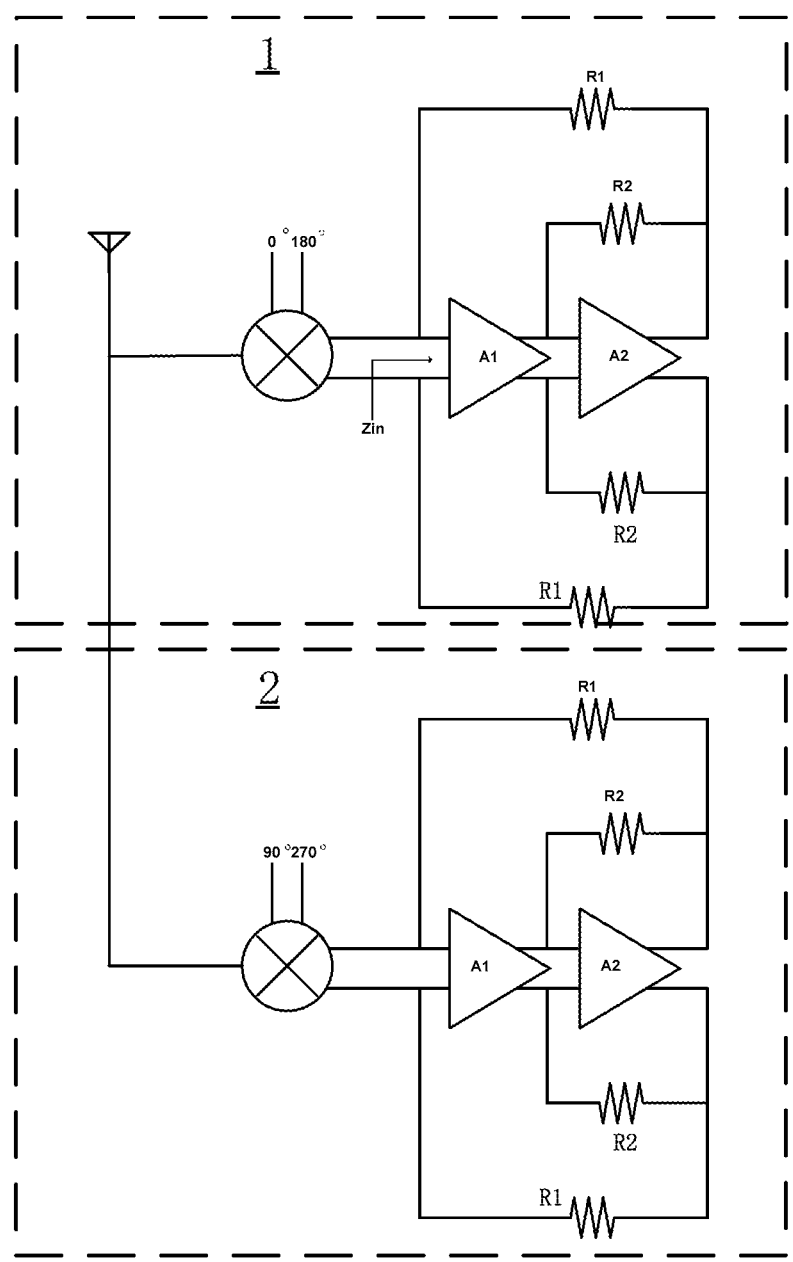
FIG. 7 is a schematic structural diagram of a signal amplifying circuit device according to another embodiment of the present invention.

In FIG. 1:
10 Mixer; 110 RF signal input terminal
121 First LO signal input terminal 122 Second LO signal input terminal
130 First mixed-signal output terminal 140 Second mixed-signal output terminal
20 First stage of amplifier 210 First input terminal 220 Second input terminal
230 First output terminal 240 Second output terminal
30 Second stage of amplifier 310 First input terminal 320 Second input terminal
330 First output terminal 340 Second output terminal
A First joint B Second joint
R1 First resistor R2 Second resistor
In FIG. 2:
111 First transistor switch 112 Second transistor switch In FIG. 3:
101 First transistor 102 Second transistor 103 Third transistor 104 Fourth transistor
In FIG. 4:
101' First transistor 102' Second transistor 103' Third transistor 104' Fourth transistor
105' Fifth transistor 106' Sixth transistor 107' Seventh transistor 108' Eighth transistor
In FIG. 6:
101" First transistor 102" Second transistor 103" Third transistor 104" Fourth transistor
105" Fifth transistor 106" Sixth transistor 107" Seventh transistor 108" Eighth transistor
109" Ninth transistor 100" Tenth transistor
C Third joint D Fourth joint
In FIG. 7:
1 First signal amplifying circuit device 2 Second signal amplifying circuit device

DETAILED DESCRIPTION

In the following description, only some exemplary embodiments are described. As will be appreciated by those skilled in the art, the described embodiments may be modified in various ways without departing from the spirit or scope of the present application. Therefore, the drawings and descriptions are essentially illustrative rather than restrictive.

In the description of the present application, it should be understood that terms such as center, longitudinal, transverse, length, width, thickness, upper, lower, front, rear, left, right, vertical, horizontal, top, bottom, inner, outer, clockwise, counterclockwise, axial, radial, and circumferential indicate an orientation or positional relationship that is based on the orientation or positional relationship shown in the drawings for the sake of the convenient and simplified description of the present application, but do not indicate or imply that the involved device or element necessarily has or operates in the specified orientation, and thus should not be understood as a limitation of the present application.

In addition, the terms "first" and "second" are used for differentiating technical features, but are not intended to indicate or imply the importance of these technical features or implicitly show the number of these technical features. Thus, technical features defined by the terms "first" and "second" may explicitly or implicitly include one or more of the technical features. In the description of the present application, the expression of "a plurality of" means two or more, unless otherwise specifically defined.

In the present application, unless otherwise specified and defined explicitly, the terms "arranged", "coupled", "connected", "fixed" and the like should be understood in a broad sense, and may refer to, for example, a fixed or detachable connection or being integrated, a mechanical, electrical or communication connection, a direct connection or an indirect connection through an intermediate medium, or a connection between two elements or the interaction between two elements. The specific meanings of the above terms in the present application may be understood by those skilled in the art depending on the specific context.

In the present application, unless otherwise specified and defined explicitly, a first feature being "above" or "below" a second feature includes that the first feature is in direct contact with the second feature, or that the first and second features are in contact with each other indirectly via an additional feature therebetween. Moreover, the first feature being "above", "over" or "on" the second feature may include that the first feature is right above or inclinedly above the second feature, or simply that the first feature is higher in level than the second feature. Likewise, the first feature being "below" or "under" the second feature may include that the first feature is right below or inclinedly below the second feature, or simply that the first feature is lower in level than the second feature.

The following disclosure provides various embodiments or examples for illustrating the implementation of various structures of the present disclosure. In order to simplify the disclosure of the present application, components and arrangements of specific examples are described below. Of course, these examples are merely illustrative, but not intended to limit the present invention. In addition, the same reference numerals may be used throughout different examples for the sake of simplification and clarity, but do not necessarily mean any relationship between the various embodiments or examples.

In a specific embodiment, as shown in FIG. 1, a signal amplifying circuit device includes a mixer 10, a first stage of amplifier 20 and a second stage of amplifier 30 which are connected in series.

The mixer 10 is configured to receive an RF signal as well as two local oscillator signals with a preset phase difference therebetween, and output a first mixed signal and a second mixed signal based on the RF signal and the two local oscillator signals.

The first stage of amplifier 20 includes a first input terminal 210 for receiving the first mixed signal, a second input terminal 220 for receiving the second mixed signal, a first output terminal 230, and a second output terminal 240.

The second stage of amplifier 30 includes a first input terminal 310 which is connected to the first output terminal 230 of the first stage of amplifier 20 at a first joint A, a second input terminal 320 which is connected to the second output terminal 240 of the first stage of amplifier 20 at a second joint B, a first output terminal 330, and a second output terminal 340. A first resistor R1 is connected in parallel between the first input terminal 210 of the first stage of amplifier 20 and the second output terminal 330 of the second stage of amplifier 30, and another first resistor R1 is connected in parallel between the second input terminal 220 of the first stage of amplifier 20 and the second output terminal 340 of the second stage of amplifier 30. Further, a second resistor R2 is connected in parallel between the first joint A and the first output terminal 330 of the second stage of amplifier 30, and another second resistor R2 is connected in parallel between the second joint B and the second output terminal 340 of the second stage of amplifier 30.

In an embodiment, an antenna for receiving RF signals is connected to the mixer 10. The mixer 10 includes an RF signal input terminal 110 for receiving an RF signal, a first LO signal input terminal 121 for receiving a first local oscillator signal, and a second LO signal input terminal 122 for receiving a second local oscillator signal, where the first local oscillator signal is different from the second local oscillator signal by a preset phase difference. For example, the first local oscillator signal has a phase of 0° and the second local oscillator signal has a phase of 180°, or the first local oscillator signal has a phase of 180° and the second local oscillator signal has a phase of 0°, thus the preset phase difference may be 180°. The mixer 10 further includes a first mixed-signal output terminal 130 configured for outputting a first mixed signal, and a second mixed-signal output terminal 140 configured for outputting a second mixed signal.

In the embodiment, the circuit structure formed by the first stage of amplifier 20, the second stage of amplifier 30, the first resistors R1 and the second resistors R2 may be referred to as a nested transimpedance amplifier. Given the transconductance gm1 of the first stage of amplifier 20, the open-loop gain A of the nested transimpedance amplifier may be calculated from the transconductance gm1 as A=gm1*$R_2$, and thus increasing the transconductance gm1 of the first stage of amplifier 20 can effectively reduce the noise figure, where R2 represents the resistance of the second resistor R2.

Given the resistance $R_1$ of the first resistor R1, the input impedance Zin of the nested transimpedance amplifier may be calculated as Zin=$R_1$/(gm1*$R_2$). In order to ensure source impedance matching, achieve relatively accurate source impedance matching, and reduce the return loss, the input impedance is fixed. In this case, the resistance R2 is decreased if the transconductance gm1 is increased.

Here, because the ratio $R_1/R_2$ of the resistance $R_1$ to the resistance $R_2$ is fixed, and the input return loss (i.e. the input reflection coefficient S11) is proportional to the ratio $R_1/R_2$, changes in the on-chip resistance $R_1$ and $R_2$ will not affect the source impedance matching. If the input reflection coefficient S11 is decreased, the input impedance matching becomes better and the signal transmission loss is reduced. Further, if the gain of the second stage of amplifier 30 is increased, the linearity of the signal amplifying circuit device is improved. The signal amplifying circuit device provided in the embodiment can obtain a linearity greater than 10 dB.

The signal amplifying circuit device provided in the embodiment not only satisfies the source impedance matching, effectively reduces the noise figure, and improves the gain and the linearity, but also reduces the area and power consumption of the circuit.

In an embodiment, as shown in FIG. 2, the mixer 10 includes a first transistor switch 111 and a second transistor switch 112, where the first transistor switch 111 includes a gate configured for receiving a first local oscillator signal, a drain configured for outputting the first mixed signal, and a source.

The second transistor switch 112 includes a gate configured for receiving a second local oscillator signal, a drain configured for outputting a second mixed signal, and a source.

The source of the first transistor switch II and the source of the second transistor switch 112 are configured for receiving the radio frequency signal.

In an embodiment, the first transistor switch 111 and the second transistor switch 112 may be P-channel Metal Oxide Semiconductor (PMOS) transistors or N-channel Metal Oxide Semiconductor (NMOS) transistors. The source of the first transistor switch 111 and the source of the second transistor switch 112 are connected to form the RF signal input terminal 110. The grid of the first transistor switch 111 serves as the first LO signal input terminal 121, and the grid of the second transistor switch 112 serves as the second LO signal input terminal 122. The drain of the first transistor switch Ill serves as the first mixed-signal output terminal 130, and the drain of the second transistor switch 112 serves as the second mixed-signal output terminal 140.

The first transistor switch 111 and the second transistor switch 112 are configured to sample and down-convert the RF signal into an intermediate frequency signal. Specifically, the RF signal can be down-converted to a differential intermediate frequency signal by using a differential sampling clock. The purpose of the down conversion is to decrease the carrier frequency of the RF signal or simply remove the carrier frequency to obtain a baseband signal. The first mixed signal and the second mixed signal may be differential intermediate frequency signals.

In an embodiment, the first LO signal has a phase of 0°, the second LO signal has a phase of 180°, and the preset phase difference between the first LO signal and the second LO signal is 180°. Alternatively, the first LO signal has a phase of 90°, the second LO signal has a phase of 270°, and the preset phase difference is 180°.

In an example, the first LO signal LOp may have a phase of 0°, the second LO signal LOn may have a phase of 180°, and thus the phase of the first mixed signal IFp is different from the phase of the second mixed signal IFn by 180°. Alternatively, the first LO signal LOp may have a phase of 90°, the second LO signal LOn may have a phase of 270°, and thus the phase of the first mixed signal IFp is different from the phase of the second mixed signal IFn by 180°. Of course, the phases of the first LO signal LOp and the second LO signal LOn and the preset phase difference may be adjusted adaptively as desired, without departing from the scope of the embodiment.

In an embodiment, the first stage of amplifier 20 and/or the second stage of amplifier 30 may be embodied by a single-stage Complementary Metal Oxide Semiconductor (CMOS) circuit element. Hereinafter, two types of the single-stage CMOS circuit elements are illustratively described as examples.

As shown in FIG. 3, a single-stage CMOS circuit element includes a first transistor 101, a second transistor 102, a third transistor 103, and a fourth transistor 104. The gates of the first transistor 101 and the third transistor 103 are connected as the first input terminal 210, the gates of the second transistor 102 and the fourth transistor 104 are connected as the second input terminal 220, the drains of the first transistor 101 and the third transistor 103 are connected as the second output terminal 240, and the drains of the second transistor 102 and the fourth transistor 104 are connected as the first output terminal 230.

In an example, two of the first, second, third and fourth transistor 101 to 104 are connected in series to form a first branch, and the other two of the first, second, third and fourth transistor 101 to 104 are connected in series to form a second branch. The first branch and the second branch are connected in parallel to form a parallel circuit, and one end of the parallel circuit is connected to a supply voltage $V_{DD}$ via a constant current source, while the other end of the parallel circuit is connected to a ground voltage $V_{SS}$ via another constant current source. Specifically, the first transistor 101 and the second transistor 102 may be PMOS transistors, and the third transistor 103 and the fourth transistor 104 may be NMOS transistors. The source of the first transistor 101 and the source of the second transistor 102 are connected to each other and both connected to the supply voltage VDD via the constant current source. The source of the third transistor 103 and the source of the fourth transistor 104 are connected to each other and both connected to the ground voltage $V_{SS}$ via the another constant current source.

It should be noted that, in the case where the first stage of amplifier 20 is embodied by the single-stage CMOS circuit unit provided in the present embodiment, the gates of the first transistor 101 and the third transistor 103 are connected as the first input terminal 210 for receiving the first mixed signal IFp (INp), the gates of the second transistor 102 and the fourth transistor 104 are connected as the second input terminal 220 for receiving the second mixed signal IFn (INn), the drains of the first transistor 101 and the third transistor 103 are connected as the second output terminal 240 for outputting a second amplified signal (OUTn), and the drains of the second transistor 102 and the fourth transistor 104 are connected as the first output terminal 230 for outputting a first amplified signal (OUTp).

In the case where the second stage of amplifier 30 is embodied by the single-stage CMOS circuit unit provided in the present embodiment, the gates of the first transistor 101 and the third transistor 103 are connected as the first input terminal 310 for receiving the first amplified signal (INp), the gates of the second transistor 102 and the fourth transistor 104 are connected as the second input terminal 320 for receiving the second amplified signal (INn), the drains of the first transistor 101 and the third transistor 103 are connected as the second output terminal 340 for outputting the fourth amplified signal (OUTn), and the drains of the second transistor 102 and the fourth transistor 104 are connected as the first output terminal 330 for outputting the third amplified signal (OUTp).

FIG. 4 shows another single-stage CMOS circuit unit which includes a first transistor 101', a second transistor 102', a third transistor 103', a fourth transistor 104', a fifth transistor 105', a sixth transistor 106', a seventh transistor 107' and an eighth transistor 108'. The first transistor 101', the third transistor 103', the fifth transistor 105' and the seventh transistor 107' are connected in series to form a first branch, while the second transistor 102', the fourth transistor 104', the sixth transistor 106' and the eighth transistor 108' are connected in series to form a second branch. The first branch and the second branch are connected in parallel to form a parallel circuit, and one end of the parallel circuit is connected to a supply voltage $V_{DD}$ via a constant current source, while the other end of the parallel circuit is connected to a ground voltage $V_{SS}$ via another constant current source. Specifically, the first transistor 101', the second transistor 102', the third transistor 103', and the fourth transistor 104' may be PMOS transistors. The fifth transistor 105', the sixth transistor 106', the seventh transistor 107', and the eighth transistor 108' may be NMOS transistors. The source of the first transistor 101' and the source of the second transistor 102' are connected to each other and both connected to the supply voltage $V_{DD}$ via the constant current source, and the source of the seventh transistor 107' and the source of the eighth transistor 108' are connected to each other and both connected to the ground voltage $V_{SS}$ via the another constant current source.

The gates of the first transistor 101' and the seventh transistor 107' are connected as the first input terminal 210, the gates of the second transistor 102' and the eighth transistor 108' are connected as the second input terminal 220, the drains of the third transistor 103' and the fifth transistor 105' are connected as the second output terminal 240, and the drains of the fourth transistor 104' and the sixth transistor 106' are connected as the first output terminal 230. The gates of the third transistor 103' and the fourth transistor 104' may be both connected to a constant voltage, and the gates of the fifth transistor 105' and the sixth transistor 106' may be both connected to another constant voltage.

It should be noted that, in the case where the first stage of amplifier 20 includes the another single-stage CMOS circuit unit provided in the embodiment, the gates of the first transistor 101' and the seventh transistor 107' are connected as the first input terminal 210 for receiving the first mixed signal IFp (INp), the gates of the second transistor 102' and the eighth transistor 108' are connected as the second input terminal 220 for receiving the second mixed signal IFn (INn), the drains of the third transistor 103' and the fifth transistor 105' are connected as the second output terminal 240 for outputting the second amplified signal (OUTn), and the drains of the fourth transistor 104' and the sixth transistor 106' are connected as the first output terminal 230 for outputting the first amplified signal (OUTp).

In the case where the second stage of amplifier 30 further includes the another single-stage CMOS circuit unit provided in the embodiment, the gates of the first transistor 101' and the seventh transistor 107' are connected as the first input terminal 310 for receiving the first amplified signal (INp), the gates of the second transistor 102' and the eighth transistor 108' are connected as the second input terminal 320 for receiving the second amplified signal (INn), the drains of the third transistor 103' and the fifth transistor 105' are connected as the second output terminal 340 for outputting the fourth amplified signal (OUTn), and the drains of the fourth transistor 104' and the sixth transistor 106' are connected as the first output terminal 330 for outputting the third amplified signal (OUTp).

In this embodiment, the provided another single-stage CMOS circuit unit has a small area and low power consumption, and furthermore can provide a sufficient current signal or voltage signal for noise reduction.

In an embodiment, the first stage of amplifier 20 and/or the second stage of amplifier 30 include a multi-stage CMOS circuit unit, which includes an input subunit, a gain subunit and an output subunit that are sequentially connected in series.

Figure 5:
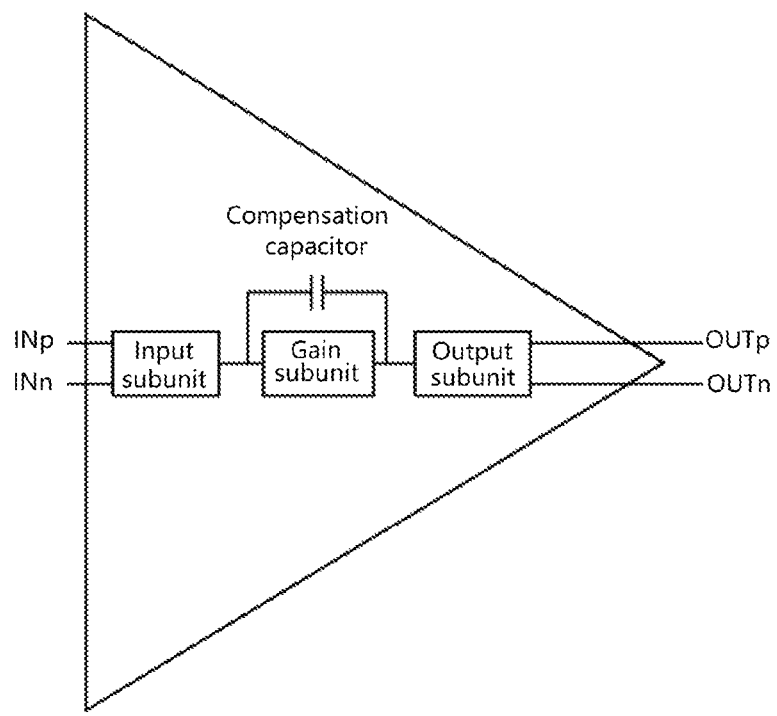
FIG. 5 is a schematic structural diagram of a first or second stage of amplifier according to still another embodiment of the present invention.

For example, as shown in FIG. 5, the multi-stage CMOS circuit unit may include an input subunit, a gain subunit, and an output subunit which are sequentially connected in series, and a phase compensation capacitor is connected in parallel with the gain subunit. In the case where the first stage of amplifier 20 is embodied by the multi-stage CMOS circuit unit, the input subunit includes the first input terminal 210 and the second input terminal 220, where the first input terminal 210 is used to receive the first mixed signal, while the second input terminal 220 is used to receive the second mixed signal, and the output subunit includes the first output terminal 230 and the second output terminal 240, which are used to output the signals differentially amplified by the first stage of amplifier 20. Of course, the first stage of amplifier 20 may alternatively embodied by the single-stage CMOS circuit unit, to likewise output the differentially amplified signals. In the case where the second stage of amplifier 30 is embodied by the multi-stage CMOS circuit unit, the input subunit includes the first input terminal 310 and the second input terminal 320 which are configured for receiving the differentially amplified signals output from the first stage of amplifier 20, and the output subunit includes the first output terminal 330 and the second output terminal 340 which are configured for outputting the signals differentially amplified by the second stage of amplifier 30.

In this embodiment, the multi-stage CMOS circuit unit can improve the open-loop gain, thereby improving the linearity.

In an embodiment, as shown in FIG. 6, a two-stage CMOS circuit unit is illustratively described for the sake of further describing the multi-stage CMOS circuit unit.

As shown in FIG. 6, the input subunit includes a first transistor 101" and a second transistor 102", where the gate of the first transistor 101" serves as the first input terminal 210, the gate of the second transistor 102" serves as the second input terminal 220, the source of the first transistor 101" and the source of the second transistor 102" are connected to the supply voltage $V_{DD}$, and the drain of the first transistor 101" and the drain of the second transistor 102" are connected to the ground voltage $V_{SS}$.

The gain subunit includes a third transistor 103", a fourth transistor 104", a fifth transistor 105" and a sixth transistor 106", where the gates of the third transistor 103" and the fourth transistor 104" are both connected to a first voltage, the sources of the third transistor 103" and the fourth transistor 104" are connected to the supply voltage $V_{DD}$, and the drains of the third transistor 103" and the fourth transistor 104" are both connected to the ground voltage $V_{SS}$.

The gates of the fifth transistor 105" and the sixth transistor 106" are both connected to a second voltage, the sources of the fifth transistor 105" and the sixth transistor 106" are both connected to the supply voltage $V_{DD}$, and the drains of the fifth transistor 105" and the sixth transistor 106" are both connected to the ground voltage $V_{SS}$.

The output subunit includes a seventh transistor 107", an eighth transistor 108", a ninth transistor 109" and a tenth transistor 100", where the gate of the seventh transistor 107" and the sources of the third transistor 103" and the fourth transistor 104" are connected at a third joint C, the source of the seventh transistor 107" is connected to the supply voltage $V_{DD}$, the drains of the seventh transistor 107" and the eighth transistor 108" are connected as the first output terminal 230, and the gate and the source of the eighth transistor 108" are connected to the ground voltage $V_{SS}$.

The gate of the ninth transistor 109" and the sources of the fifth transistor 105" and the sixth transistor 106" are connected at a fourth joint D, the source of the ninth transistor 109" is connected to supply voltage $V_{DD}$, the drains of the ninth transistor 109" and the tenth transistor 100" are connected as the second output terminal 240, and the gate and source of the tenth transistor 100" are connected to the ground voltage $V_{SS}$.

In an example, the first transistor 101", the second transistor 102", the third transistor 103", the sixth transistor 106", the seventh transistor 107", and the ninth transistor 109" may be PMOS transistors, while the fourth transistor 104", the fifth transistor 105", the eighth transistor 108", and the tenth transistor 100" may be NMOS transistors. The sources of the first transistor 101" and the second transistor 102" are connected to each other and both connected to the supply voltage $V_{DD}$ via a constant current source, the drain of the first transistor 101" and the drain of the second transistor 102" are connected to the ground voltage $V_{SS}$ via two constant current sources, respectively. The gate of the seventh transistor 107" and the sources of the third transistor 103" and the fourth transistor 104" are connected at the third joint C and further connected to the supply voltage $V_{DD}$ via a constant current source. The source of the seventh transistor 107" may be directly connected to the supply voltage $V_{DD}$. The gate of the eighth transistor 108" and the drains of the third transistor 103" and the fourth transistor 104" are connected to each other and further connected to the ground voltage $V_{SS}$ via a constant current source, and the drain of the eighth transistor 108" may be directly connected to the ground voltage $V_{SS}$. Similarly, the gate of the ninth transistor 109" and the sources of the fifth transistor 105" and the sixth transistor 106" are connected at the fourth joint and further connected to the supply voltage $V_{DD}$ via a constant current source. The source of the ninth transistor 109" may be directly connected to the supply voltage $V_{DD}$. The gate of the tenth transistor 100" and the drains of the fifth transistor 105" and the sixth transistor 106" are connected to each other and further connected to the ground voltage $V_{SS}$ via a constant current source, and the drain of the tenth transistor 100" may be directly connected to the ground voltage $V_{SS}$.

It should be noted that, in the case where the first stage of amplifier 20 is embodied by the two-stage CMOS circuit unit provided in this embodiment, the gate of the first transistor 101" serves as the first input terminal 210 for receiving the first mixed signal IFp (INp), the gate of the second transistor 102" serves as the second input terminal 220 for receiving the second mixed signal IFn (INn), the drains of the seventh transistor 107" and the eighth transistor 108" are connected as the first output terminal 230 for outputting the first amplified signal (OUTp), and the drains of the ninth transistor 109" and the tenth transistor 100" are connected as the second output terminal 240 for outputting the second amplified signal (OUTn).

In the case where the second stage of amplifier 20 is embodied by the two-stage CMOS circuit unit provided in this embodiment, the gate of the first transistor 101" serves as the first input terminal 310 for receiving the first amplified signal (INp), the gate of the second transistor 102" serves as the second input terminal 320 for receiving the second amplified signal (INn), the drains of the seventh transistor 107" and the eighth transistor 108" are connected as the first output terminal 330 for outputting the third amplified signal (OUTp), and the drains of the ninth transistor 109" and the tenth transistor 100" are connected as the second output terminal 340 for outputting the fourth amplified signal (OUTn).

Of course, the multi-stage CMOS circuit unit can be modified as actually desired, without departing from the protection scope of the present invention.

As shown in FIG. 7, an embodiment provides a receiver which includes at least one signal amplifying circuit device provided in the above embodiments. For example, the receiver may include a signal amplifying circuit device 1 and a signal amplifying circuit device 2. A first LO signal and a second LO signal received by the mixer 10 of the signal amplifying circuit device 1 may have a phase of 0° and a phase of 180°, respectively, and a first LO signal and a second LO signal received by the mixer 10 of the signal amplifying circuit device 2 may have a phase of 90° and a phase of 270°, respectively.

Of course, the number of the signal amplifying circuit devices in the receiver may be varied depending on actual needs, without departing from the protection scope of the present invention.

Figure 8:
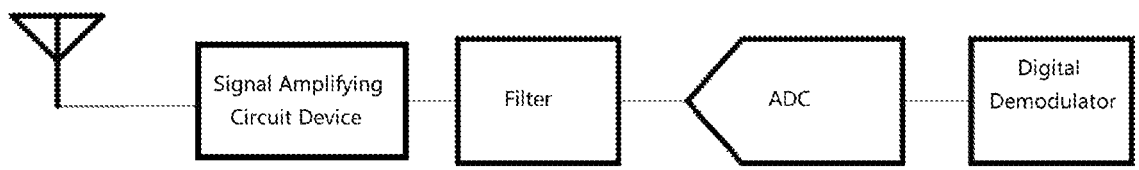
FIG. 8 is a schematic diagram of a receiver according to an embodiment of the present invention.

As shown in FIG. 8, the signal amplifying circuit device is followed by a filter, an Analog-to-Digital Converter and a digital demodulator which are sequentially connected. Specifically, the first output terminal 330 and the second output terminal 340 of the second stage of amplifier 30 of the signal amplifying circuit device are connected to the filter, which may be an analog baseband filter, for example. Because the signal amplifying circuit device provided in the above embodiments takes place of the band-pass or low-pass filter, MN, LNA and the mixer in the existing receiver, the size of the receiver is significantly reduced, power consumption is decreased, and the efficiency of signal amplification is improved.

The above description illustrates merely some specific implementation of the present disclosure, but is not intended to limit the scope of protection of the present invention, and any variation or replacement readily occurring to those skilled in the art within the technical scope disclosed by the present invention should be covered by the protection scope of the present invention. Therefore, the protection scope of the present invention should be subject to the protection scope of the claims.

What is claimed is:

1. A signal amplifying circuit device, comprising a mixer, a first stage of amplifier and a second stage of amplifier which are connected in series,
   wherein the mixer is configured to receive a Radio Frequency signal and two local oscillator signals with a preset phase difference therebetween, and output a first mixed signal and a second mixed signal based on the Radio Frequency signal and the two local oscillator signals,
   the first stage of amplifier includes a first input terminal configured for receiving the first mixed signal, a second input terminal configured for receiving the second mixed signal, a first output terminal, and a second output terminal,
   the second stage of amplifier includes a first input terminal, a second input terminal, a first output terminal, and a second output terminal; the first input terminal of the second stage of amplifier and the first output terminal of the first stage of amplifier are connected at a first joint; the second input terminal of the second stage of amplifier and the second output terminal of the first stage of amplifier are connected at a second joint; a first resistor is connected in parallel between the first input terminal of the first stage of amplifier and the first output terminal of the second stage of amplifier, another first resistor is connected in parallel between the second input terminal of the first stage of amplifier and the second output terminal of the second stage of amplifier, a second resistor is connected in parallel between the first joint and the first output terminal of the second stage of amplifier, and another second resistor is connected in parallel between the second joint and the second output terminal of the second stage of amplifier.

2. The circuit device of claim 1, wherein the mixer includes a first transistor switch and a second transistor switch,
   the first transistor switch includes a gate configured for receiving a first local oscillator signal, a drain configured for outputting the first mixed signal, and a source;
   the second transistor switch includes a gate configured for receiving a second local oscillator signal, a drain configured for outputting the second mixed signal, and a source;
   the sources of the first transistor switch and the second transistor switch are configured for receiving the Radio Frequency signal.

3. The circuit device of claim 2, wherein the first local oscillator signal has a phase of 0°, and the second local oscillator signal has a phase of 180°; or the first local oscillator signal has a phase of 90°, and the second local oscillator signal has a phase of 270°.

4. The circuit device of claim 1, wherein the first stage of amplifier and/or the second stage of amplifier include a single-stage Complementary Metal Oxide Semiconductor circuit unit.

5. The circuit device of claim 4, wherein the single-stage Complementary Metal Oxide Semiconductor circuit unit includes a first transistor, a second transistor, a third transistor, and a fourth transistor;
   the gates of the first transistor and the third transistor are connected as the first input terminal, the gates of the second transistor and the fourth transistor are connected as the second input terminal, the drains of the first transistor and the third transistor are connected as the second output terminal, and the drains of the second transistor and the fourth transistor are connected as the first output terminal.

6. The circuit device of claim 1, wherein the first stage of amplifier and/or the second stage of amplifier include a multi-stage Complementary Metal Oxide Semiconductor circuit unit, and the multi stage Complementary Metal Oxide Semiconductor circuit unit includes an input subunit, a gain subunit and an output subunit which are sequentially connected in series.

7. The circuit device of claim 6, wherein the input subunit includes a first transistor and a second transistor, a gate of the first transistor serves as the first input terminal, a gate of the second transistor serves as the second input terminal, the sources of the first transistor and the second transistor are connected to a supply voltage $V_{DD}$, and the drains of the first transistor and the second transistor are connect to a ground voltage $V_{SS}$;

the gain subunit includes a third transistor, a fourth transistor, a fifth transistor and a sixth transistor, gates of the third transistor and the fourth transistor are both connected to a first voltage, sources of the third transistor and the fourth transistor are both connected to the supply voltage $V_{DD}$, and drains of the third transistor and the fourth transistor are connected to the ground voltage $V_{SS}$;

gates of the fifth transistor and the sixth transistor are both connected to a second voltage, sources of the fifth transistor and the sixth transistor are connected to the supply voltage $V_{DD}$, and drains of the fifth transistor and the sixth transistor are connected to the ground voltage $V_{SS}$;

the output subunit includes a seventh transistor, an eighth transistor, a ninth transistor and a tenth transistor; a gate of the seventh transistor and sources of the third and fourth transistors are connected at a third joint, a source of the seventh transistor is connected to the supply voltage $V_{DD}$, drains of the seventh and eighth transistors are connected as the first output terminal, and a gate and a source of the eighth transistor are connect to the ground voltage $V_{SS}$;

a gate of the ninth transistor and sources of the fifth and sixth transistors are connected at the fourth joint, a source of the ninth transistor is connected to supply voltage $V_{DD}$, drains of the ninth and tenth transistors are connected as the second output terminal, and a gate and a source of the tenth transistor are connected to the ground voltage $V_{SS}$.

8. A receiver comprising at least one signal amplifying circuit device of claim 1.

* * * * *